United States Patent [19]

Chang et al.

[11] Patent Number: 5,439,842
[45] Date of Patent: Aug. 8, 1995

[54] LOW TEMPERATURE OXIDE LAYER OVER FIELD IMPLANT MASK

[75] Inventors: Mike F. Chang, Cupertino; David G. Grasso, San Jose; Jun-Wei Chen, Saratoga, all of Calif.

[73] Assignee: Siliconix Incorporated, Santa Clara, Calif.

[21] Appl. No.: 236,299

[22] Filed: May 2, 1994

Related U.S. Application Data

[63] Continuation-in-part of Ser. No. 949,288, Sep. 21, 1992, Pat. No. 5,328,866.

[51] Int. Cl.$^6$ ............................................. H01L 21/76
[52] U.S. Cl. ...................................... 437/70; 437/69; 437/51; 437/27; 437/34
[58] Field of Search .................. 437/69, 70, 27, 34, 437/968, 51

[56] References Cited

U.S. PATENT DOCUMENTS

| | | | |
|---|---|---|---|
| 4,110,899 | 9/1978 | Nagasawa et al. | 437/34 |
| 4,277,291 | 7/1981 | Cerofolini et al. | 437/70 |
| 4,373,965 | 2/1983 | Smigelski | 437/70 |
| 4,391,650 | 7/1983 | Pfeifer et al. | 437/34 |
| 4,812,418 | 3/1989 | Pfiester et al. | 437/69 |
| 4,829,019 | 5/1989 | Mitchell et al. | 437/70 |
| 4,879,583 | 11/1989 | Custode | 257/375 |
| 4,887,142 | 12/1989 | Bertotti et al. | 257/547 |
| 4,912,062 | 3/1990 | Verma | 437/70 |
| 5,156,989 | 10/1992 | Williams et al. | 437/34 |
| 5,242,849 | 9/1993 | Sato | 437/70 |

OTHER PUBLICATIONS

"Semiconductor Processing For The VLSI Era, vol. 2: Process Integration", Stanley Wolf, Lattice Press, 1990, pp. 12–45.

"Semiconductor Integrated Circuit Processing Technology", Walter Runyan et al., Addison–Wesley Publishing Company, 1990, pp. 108–112.

"Integrated Circuit Engineering, Design, Fabrication and Applications", Arthur Glaser et al., Addison–Wesley Publishing Company, 1977, pp. 260–263.

*Primary Examiner*—Brian E. Hearn
*Assistant Examiner*—Trung Dang
*Attorney, Agent, or Firm*—Skjerven, Morrill, MacPherson, Franklin & Friel; Norman R. Klivens; T. Lester Wallace

[57] ABSTRACT

A thin base oxide is disposed over both an active area and also over a field area of a substrate. A thin silicon-nitride layer is then formed over the base oxide in the active area to protect the underlying substrate from oxygen and/or water vapor during a subsequent field oxidation step. This thin nitride layer is, however, insufficiently thick to serve as a field implant mask in a subsequent field implant step. An additional low temperature oxide (LTO) layer is therefore provided over the nitride layer in the active area. The field implant step is then performed using the base oxide, the thin nitride, and the overlying LTO as a field implant mask. The boundaries of the overlying LTO define a field implant boundary. After the field implant step but before the field oxidation step, the LTO layer is removed from the top of the thin nitride layer. As a result, only the base oxide and the thin nitride layer is disposed over the active area during field oxidation. Therefore, in comparison to previous methods using thicker nitride layers, the present invention employs a thin nitride layer during the field oxidation step, thereby reducing the amount of stress induced in the nitride layer and thereby minimizing problems associated with thick nitride layers such as the introduction of lattice defects into the underlying silicon substrate. The thin nitride process of the present invention may, for example, be incorporated into a BiCDMOS process.

11 Claims, 11 Drawing Sheets

FIELD REGION | ACTIVE REGION

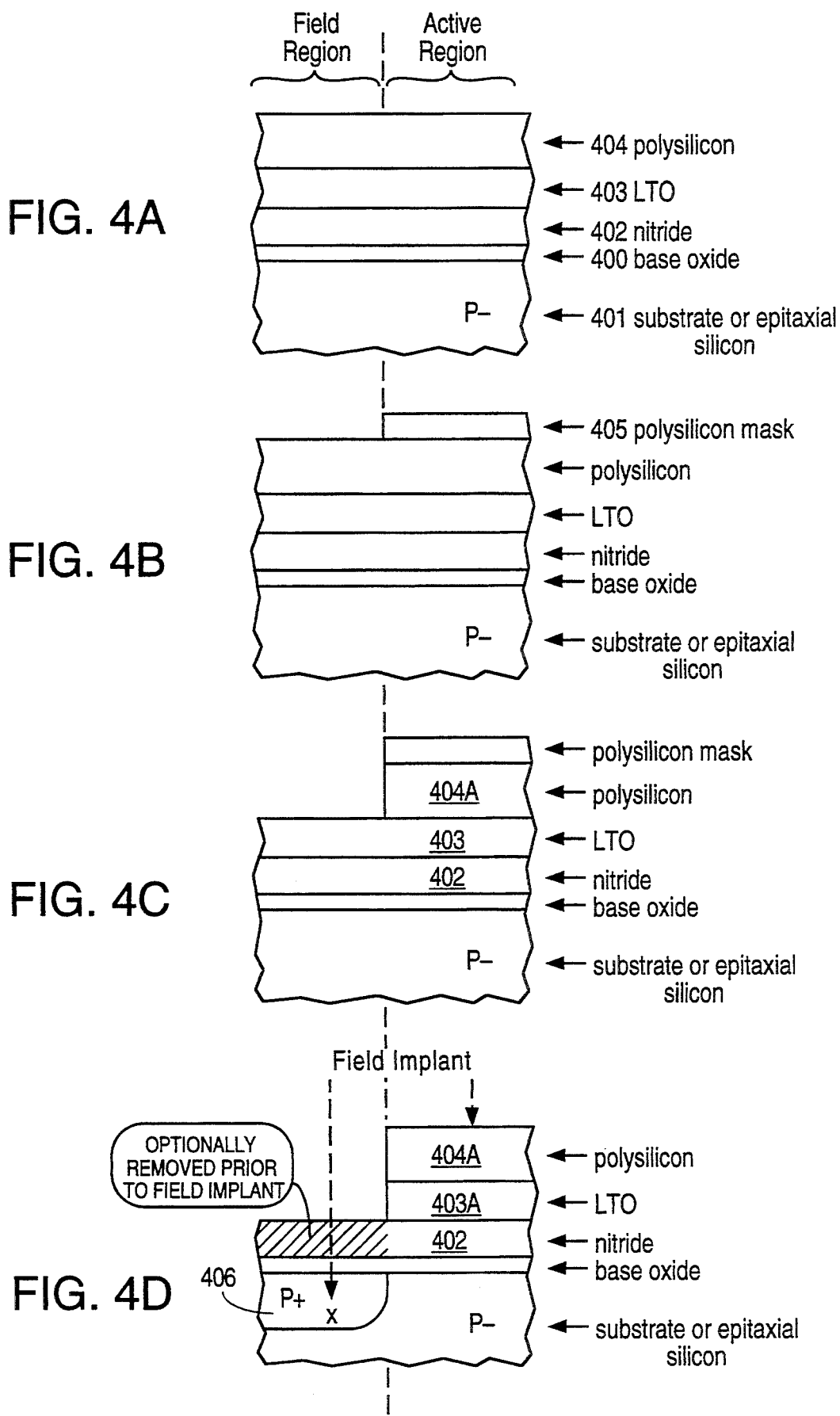

Field Region | Active Region

LOW TEMPERATURE OXIDE LAYER OVER FIELD IMPLANT MASK

RELATED APPLICATIONS

This is a continuation-in-part of application Ser. No. 07/949,288, filed Sep. 21, 1992, now U.S. Pat. No. 3,328,866.

FIELD OF THE INVENTION

This invention relates to a process for forming a region of field oxide having an underlying self-aligned field implant.

BACKGROUND OF THE INVENTION

In MOSFET (metal oxide silicon field effect transistor) integrated circuit structures, for example, multiple laterally disposed MOSFETs are typically formed on the top surface of a semiconductor substrate. These multiple individual MOSFETs are interconnected in a desired fashion using electrically conductive lines which are disposed over, but still insulated from, the top surface of the underlying substrate. If such an electrically conductive line were to extend over a region having either two N type semiconductor regions separated by a P type semiconductor region or two P type semiconductor regions separated by an N type semiconductor region, then the overlying electrically conductive line would form the gate of an undesired MOSFET.

To prevent such an undesired MOSFET from turning on, the threshold voltage of the undesired MOSFET is made to be sufficiently higher than the threshold voltages of the desired MOSFETs on the substrate. Accordingly, the switching on and off of desired MOSFETs via the electrically conductive lines will not cause any undesired intervening MOSFETs to turn on. This increasing of the threshold voltage of the undesired MOSFETs may be accomplished in at least two ways: 1) by doping the channel region of the undesired MOSFET to increase the threshold voltage at which inversion of the channel region will occur, and 2) by increasing the thickness of the field oxide insulator between the electrically conductive line (the gate of the undesired MOSFET) and the underlying channel region of the undesired MOSFET. The LOCOS (LOCal Oxidation of Silicon) process is a well known process commonly used to carry out the above described principles to increase the threshold voltage of intervening undesired MOSFETs. The LOCOS process results in an isolation structure comprising a thick oxide layer (commonly referred to as the field oxide) and an underlying doped field implant layer (commonly referred to as the channel-stop or the field implant).

According to one type of LOCOS process, a layer of a material which is relatively impervious to oxygen and water vapor is formed on the top surface of a semiconductor substrate. The material commonly used is silicon-nitride, hereafter simply referred to as "nitride". This nitride layer is selectively etched away in the field regions leaving only the active regions covered by nitride. After the exposed field regions are ion implanted with a channel-stop dopant, a thermal oxidation process is performed to grow a relatively thick field oxide in the exposed field regions. Due to the oxygen and water vapor impervious characteristics of the nitride layer, the surface of the substrate in the active area is not oxidized in this step.

Tensile stress, however, develops at the silicon-to-nitride boundary. This results in a lateral force being applied to the underlying substrate which, if adequately great, can cause defects in the silicon substrate by dislocation of silicon atoms from the silicon crystal lattice. Because transistor performance is degraded when transistors are built in silicon containing defects, usable silicon area on the die is lost and the resulting integrated circuit cannot be made as small as it otherwise could be. A thin layer of silicon dioxide is therefore commonly provided between the nitride layer and the underlying substrate to reduce the transmission of stress from the silicon to nitride boundary to the substrate and thereby to prevent lattice defects from forming in the substrate.

Silicon dioxide, however, is relatively pervious to oxygen and water vapor. As a result, oxygen and/or water vapor may diffuse laterally into the oxide layer from the exposed side edges of the oxide layer at the field region/active region boundary. As a result, silicon underneath the outer portions of the nitride layer is oxidized. Because the volume of silicon dioxide is almost twice the volume of the silicon it consumes, the silicon dioxide growing under the lateral extent of the nitride layer also lifts the lateral extent of the nitride layer. The more the nitride layer is lifted, the greater the opening for oxygen and/or water vapor to diffuse laterally through the oxide. The resulting shape of the oxide is commonly referred to as a "bird's beak" which points in toward the active region.

Texts describing uses of the LOCOS process, recognized problems with the LOCOS process, and variations on the LOCOS process include: *Silicon Processing For The VLSI Era, Volume 2: Process Integration,* by Stanley Wolf, Lattice Press, 1990, pages 12–45; *Semiconductor Integrated Circuit Processing Technology,* by Walter Runyan and Kenneth Bean, Addison-Wesley Publishing Company, 1990, pages 108–112; and *Integrated Circuit Engineering, Design, Fabrication, and Applications,* by Arthur Glaser and Gerald Subak-Sharpe, Addison-Wesley Publishing Company, 1977.

In some LOCOS processes, the nitride layer and the underlying silicon dioxide layer are used as a mask to protect the active region during the field implant step. This way the boundaries of the field implant region will be self-aligned with the boundaries of the nitride layer. When the field oxide is grown in a later step, the field oxide will similarly be aligned with the underlying field implant region. Because an unprotected silicon surface may be damaged during ion implantation, the silicon dioxide layer between the nitride layer and the underlying substrate typically extends over the field region as well as over the active region. The field implant is then performed through the silicon dioxide layer in the field regions, the nitride layer serving to define the boundaries of the implanted region. The nitride layer can more easily block the relatively large phosphorous N-field ions, but the smaller boron P-field ions can penetrate a significantly greater distance through the nitride layer. As a consequence, extra masking protection needs to be provided for the active region without losing the self-aligning feature of the active region nitride mask.

A technique has heretofore been used to provide this masking protection for the active regions. A thicker nitride layer adequately thick to block the smaller boron ions is provided. This technique, however, has drawbacks. Providing a thicker nitride layer may introduce greater stress in the underlying substrate, may cause the nitride layer to develop cracks, may result in a so-called "white ribbon" or "Kooi nitride" thinning of the edges of the field oxide, and may present etching problems. Because thinning of the field oxide reduces the voltage at which the underlying silicon will invert, the isolation function of the field oxide is degraded.

FIG. 1A (PRIOR ART) is a cross-sectional view of thick nitride layer 1 and an underlying oxide layer 2 of the prior art. It is the thick nitride layer 1 and the underlying thin base oxide layer 2 which together mask implanted ions before field oxidation during the field implant step.

FIG. 1B (PRIOR ART) is a cross-sectional view of a self-aligned boundary 3 between an active region and a field region. Thick nitride layer 1 and thin base oxide 2 are shown disposed over the top surface of substrate 7 in the active region after the field oxidation step has been performed. A field implant region 5 is shown disposed underneath field oxide layer 6 in the field region. A bird's beak 4 of silicon dioxide at the rightmost extent of field oxide 6 is shown wedging underneath the leftmost extent of thick nitride layer 1 between the nitride layer 1 and the substrate 7. The leftmost extent of nitride layer 1 is therefore shown deformed and bent upward by the bird's beak. The resistance of the thick nitride layer 1 to this deformation causes the nitride layer 1 to exert a force on the underlying silicon substrate in the vicinity of the self-aligned boundary 3. As described above, exerting a force on the substrate has deleterious consequences including the formation of dislocation defects in the silicon lattice of substrate 7. The more the nitride layer resists the deformation, the greater the stress and the greater the force. Because a thicker nitride layer 1 resists the deformation more than a thinner nitride layer, increasing the thickness of the nitride layer commonly results in silicon defects in the silicon substrate around the bird's beak 4.

After the field oxide layer 6 has been grown, the nitride layer 1 and the underlying base oxide layer 2 are removed from the active region, thereby leaving the field oxide layer in the field region.

SUMMARY OF THE INVENTION

The present invention provides the required active region masking without the attendant drawbacks of an extra selective oxidation step or a thicker nitride layer. According to one embodiment of the present invention, a base oxide is disposed over both the active region and also over the field region of the substrate. A relatively thin nitride layer is then provided over the base oxide in the active region to protect the underlying substrate from oxidation. An additional low temperature oxide (LTO) layer is then provided over the nitride layer in the active region to provide the remaining amount of protection required to protect the active region during the field implanting step. Field implanting is then performed using the base oxide, thin nitride, and LTO structure as a field implant mask. After the field implant step but before a field oxidation step, the LTO layer is removed from the thin nitride layer. As a result, only the base oxide and the thin nitride layer is disposed over the active region during the subsequent field oxidation and bird's beak formation. Therefore, in comparison to previous methods using thicker nitride layers, the present invention reduces the amount of stress induced in the nitride layer because the nitride layer is thinner. As a result, problems associated with thick nitride layers are avoided including Kooi nitride problems and including the introduction of lattice defects into the underlying silicon substrate.

In some embodiments of the present invention, a polysilicon layer is used as part of a field implant mask so that the thickness of the low temperature oxide part of the mask can be made thinner. As a result, the low temperature oxide part of the mask in the active regions is removed without removing as much of the base oxide layer over the field regions. More of the base oxide layer can therefore be made to remain over the field regions at the beginning of field oxidation.

BRIEF DESCRIPTION OF THE DRAWINGS

FIGS. 4A–4I illustrate (not to scale) other embodiments in accordance with the present invention.

DETAILED DESCRIPTION OF THE PREFERRED EMBODIMENTS

FIGS. 2A–2I are cross-sectional views showing various stages in the processing of a self-aligned boundary region 201 between an active region 202 and a field region 203 of a semiconductor body 205.

Figure 1A:
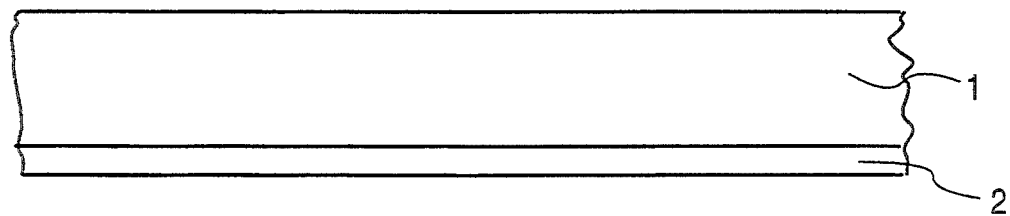
FIG. 1A (PRIOR ART) is a cross-sectional view of a thick nitride LOCOS mask according to the prior art.
Figure 1B:
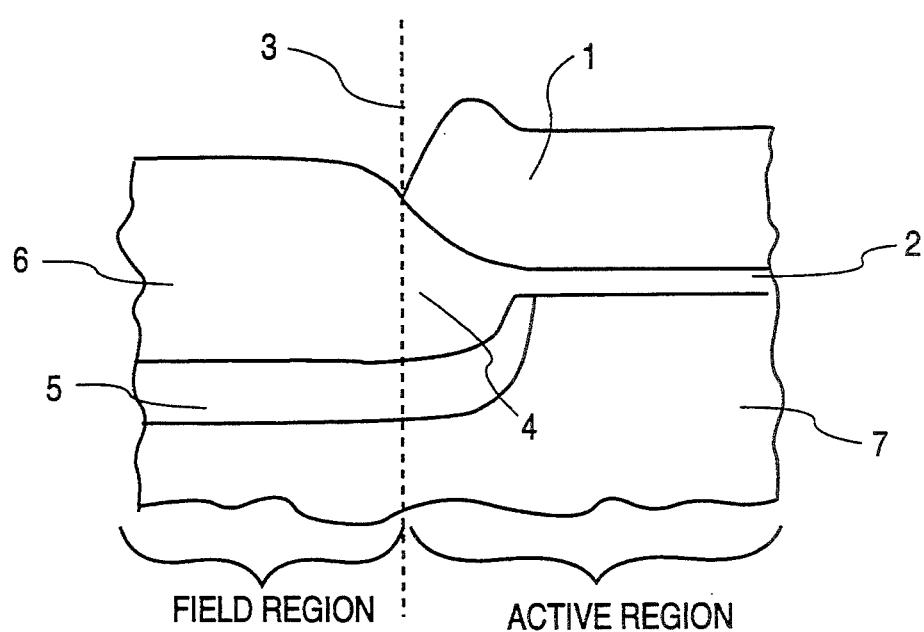
FIG. 1B (PRIOR ART) is a cross-sectional view of a self-aligned boundary between a field region and an active region using a thick nitride LOCOS mask according to the prior art.
Figure 2A:
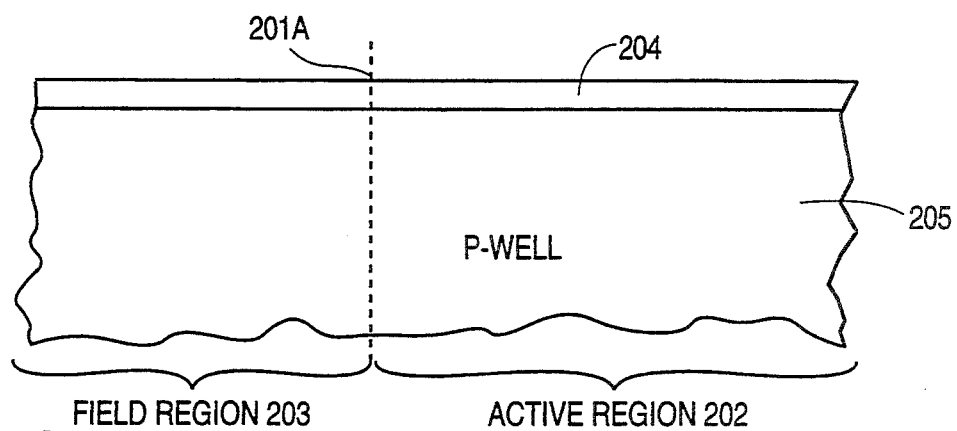
FIGS. 2A–2G are cross-sectional views showing various stages in the formation of a field oxide structure according to one embodiment of the present invention.

FIG. 2A shows a step in the process wherein a base oxide layer 204 is formed on the top surface of an P-type semiconductor body 205. In the embodiment shown in FIG. 2A, the semiconductor body is a P- type well region. This semiconductor body may, however, be any semiconductor body such as, for example, a substrate, an epitaxial layer of silicon, or a well region. In FIG. 2A, an upper surface of the semiconductor body 205 extends up to the bottom surface of the base oxide 204. Base oxide layer 204 is disposed over both the active region and also in the field region. In FIG. 2A, the active region 202 lies to the right of boundary 201. The field region 203 lies to the left of boundary 201. The base oxide 204 may, for example, be a thermally grown oxide grown to a thickness of approximately 500 Angstroms.

Figure 2B:
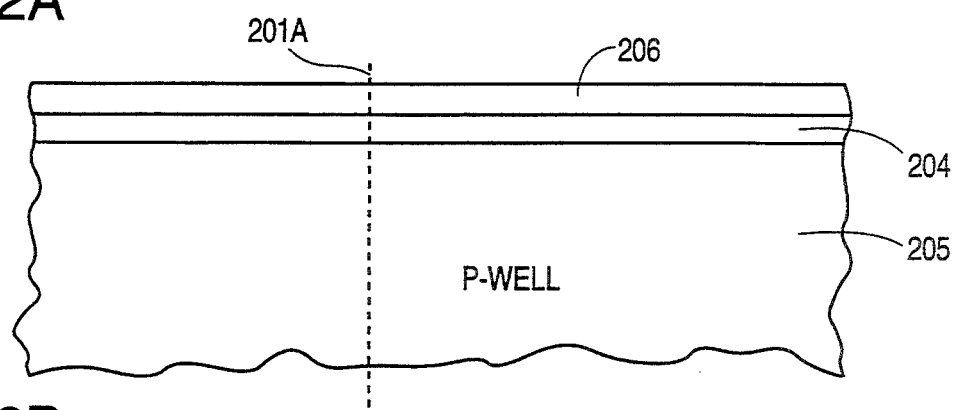

FIG. 2B shows a step of forming a thin silicon nitride layer 206 over the top surface of base oxide layer 204. Thin silicon-nitride layer 206 (hereafter referred to as the nitride layer) extends over both the active region 202 and also the field region 203. The thin nitride layer 204 may, for example, be formed by CVD deposition to have a thickness of approximately 500 to 1000 Angstroms.

Figure 2C:
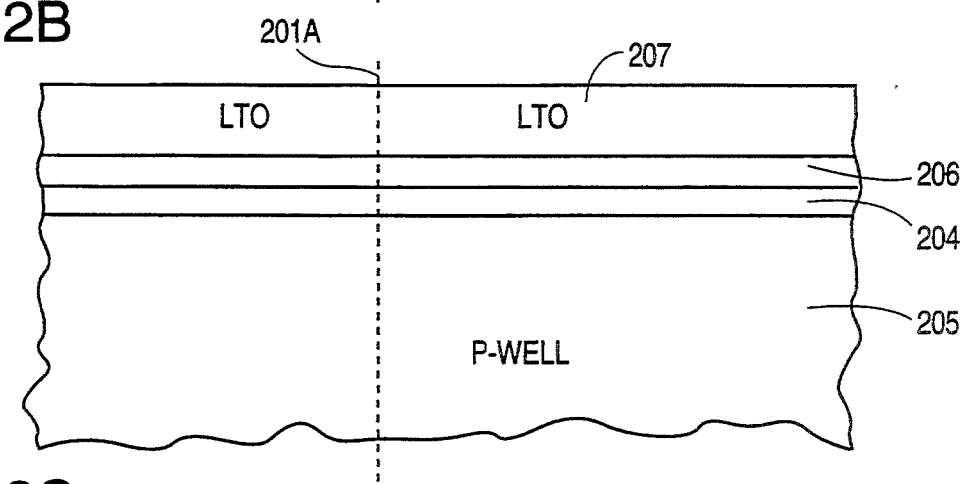

FIG. 2C shows a step of forming a low temperature oxide layer 207 (LTO) over the thin nitride layer 206. The LTO layer 207 extends over both the active region and also the field region. The LTO layer 207 may, for example, be formed by Novellus (SiH$_4$+2NO$_2$→SiO$_2$+2N$_2$+2H$_2$) deposition at 400° C. for 28 minutes to have a thickness of approximately 2000 Angstroms.

Figure 2D:
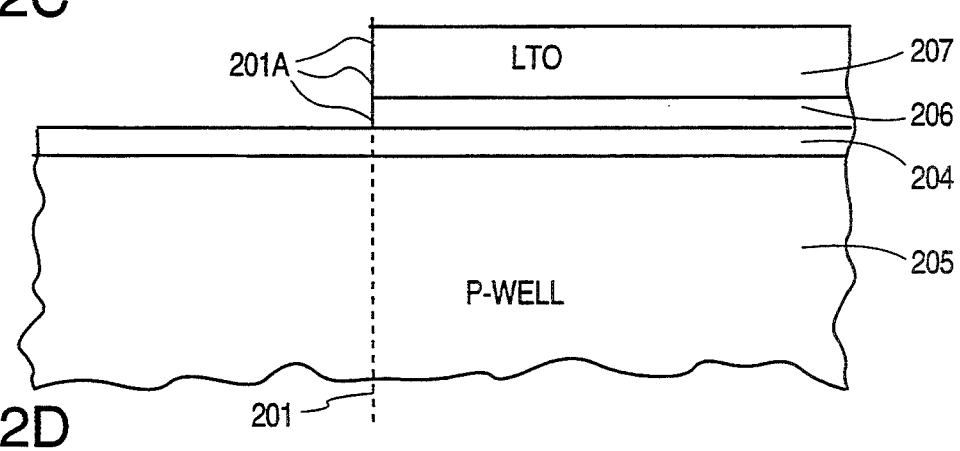

FIG. 2D shows a step of removing the LTO and thin nitride layers from the field region. This step may, for example, be performed by selectively forming a mask of photoresist over the LTO layer 207 in the active region 202 and then etching away the LTO and underlying thin nitride layer with a dry etch. Accordingly, a substantially vertical sidewall 201A is formed at boundary 201. This sidewall 201A is formed both by LTO layer 207 and also by nitride layer 206.

Figure 2E:
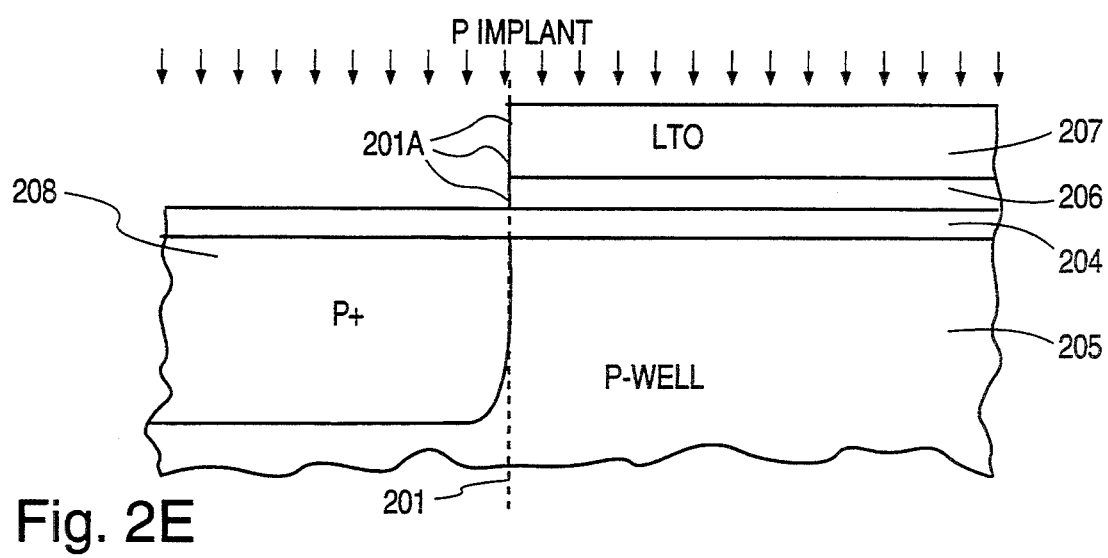

FIG. 2E shows P+ type field implant step wherein the LTO 207, thin nitride 206, and base oxide 204 structure over the active region 202 serve as an implant mask to block P type ions from reaching the underlying semiconductor body 205 under the base oxide 204 in the active region 202. In the field region, however, a P+ type field implant forms a P type silicon channel-stop region 208. The boundaries of the channel-stop region 208 are therefore self-aligned with the boundary 201 of the LTO and thin nitride layer mask at the sidewall 201A. The P+ type field implant step may, for example, be an implant of boron ions accelerated to an energy of 40 KeV and driven into the semiconductor body 205 and then diffused to a depth of approximately 10,000 Angstroms. The projected range of the boron ions into the 2000 Angstrom thick LTO may, for example, be 1400 Angstroms with a standard density of approximately 510 Angstroms. With a standard deviation of approximately 510 Angstroms, 66 percent of the boron ions will be blocked by the top 1400 Angstroms of the LTO.

Figure 2F:
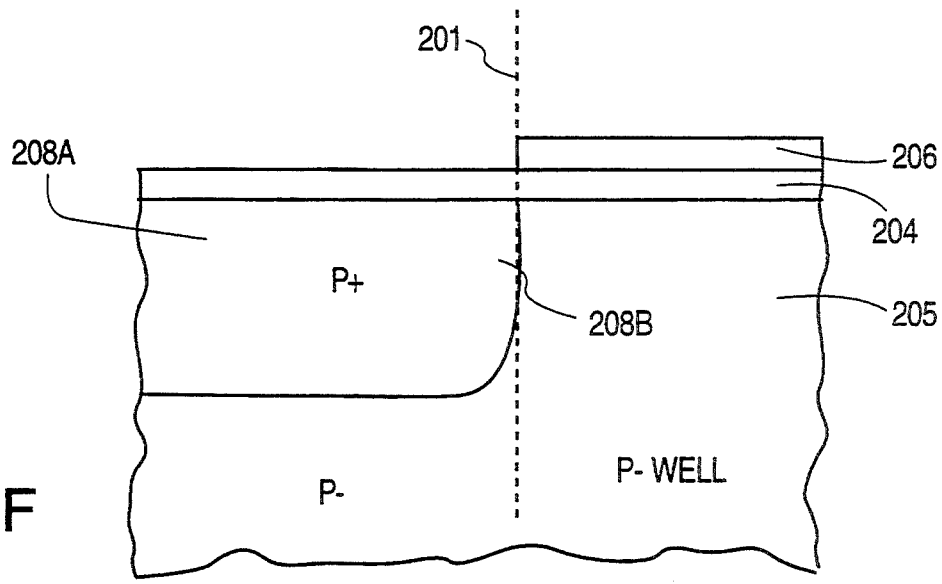

FIG. 2F shows a step of removing the LTO layer 207. The resulting structure is P+ type doped silicon in channel-stop region 208, a base oxide 204 extending over both the active region and also the field region, and a thin nitride layer 206 disposed on the base oxide 204 in the active region.

Figure 2G:
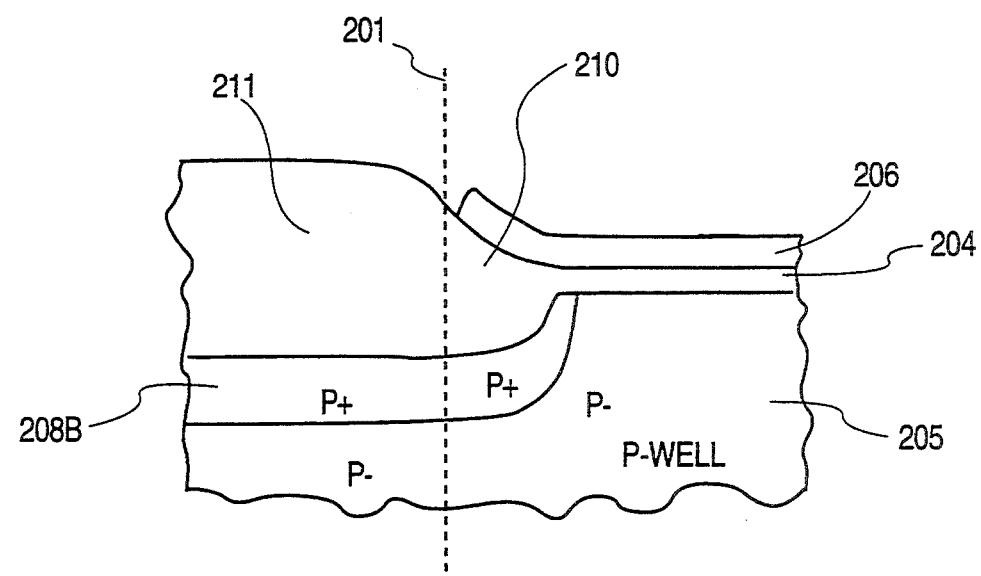

FIG. 2G shows a step of forming a field oxide in the field region 203. Although the nitride layer 206 is relatively imperious to oxygen and water vapor, the base oxide underneath the nitride is pervious to oxygen and water vapor. As a consequence, silicon at the silicon-base oxide boundary in the field region oxidizes. Because silicon dioxide occupies about twice the volume of the silicon which it consumes, the result is that the top surface of the oxide in the field region moves upward.

Because the base oxide is pervious to oxygen and water vapor, oxygen and/or water vapor are able to diffuse laterally to the right in FIG. 2G between the nitride layer 206 and the underlying semiconductor body 205 through the thin oxide layer 204 in the vicinity of the self-aligned boundary 201. As the oxide grows between the nitride 206 and the semiconductor body 205, the nitride layer 206 is pushed upward in the vicinity of the self-aligned boundary to form a pointed oxide structure 210 commonly called a "bird's beak". As the nitride 206 is pushed up, oxygen and/or water vapor are able to diffuse farther in a lateral direction thereby extending the bird's beak 210 farther and farther in a lateral direction between the nitride layer 206 and the semiconductor body 205. The field oxide 211 may, for example, be thermally grown at 950° C. to have a thickness of approximately 8,000 Angstroms. The bird's beak 210 may extend up to 0.75 μm (7,500 Angstroms) laterally into the active region beyond the self-aligned boundary 201. Despite the formation of the bird's beak 210, the field oxide 211 is nevertheless still self-aligned with the boundary 201 because only one mask, the mask which restricted the LTO 207 and nitride 206 layers to the active region, has been used. The P+ type field implant channel-stop region 208 is shown in FIG. 2G to extend downward into the substrate approximately 2.00 μm (20,000 Angstroms) below the bottom extent of the field oxide 211.

Figure 3A:
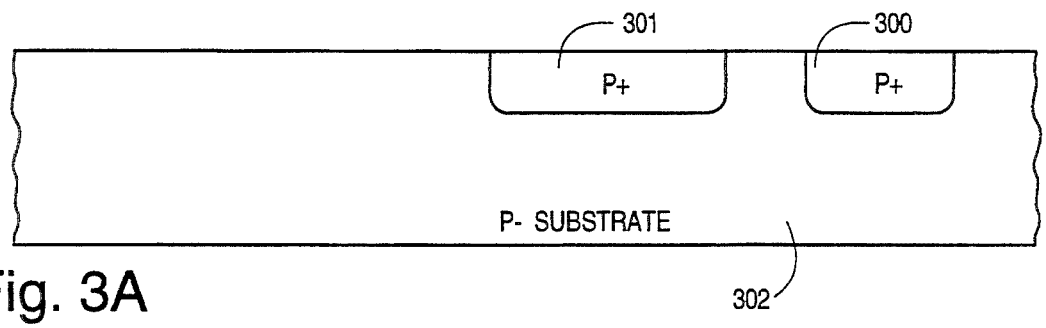
FIGS. 3A–3L are cross-sectional views of a BiCDMOS process incorporating one embodiment of the present invention.
Figure 3B:
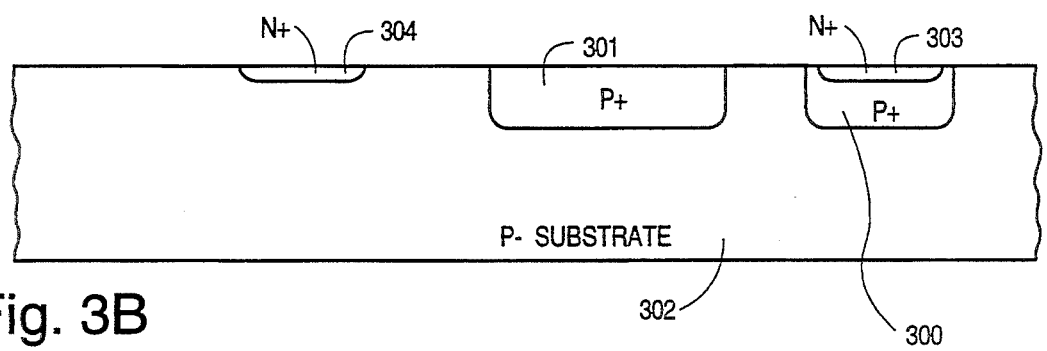

FIGS. 3A–3L are cross-sectional views of a BiCDMOS process incorporating the field oxide unit process described above. As shown in FIG. 3A, N+ type diffusions 303 and 304 are formed in a upper surface of a P type substrate 302. As shown in FIG. 3B, two relatively deep P+ type implants 300 and 301 are then formed in the top surface of the substrate 302. The lateral boundaries of N+ diffusion 303 extend beyond the lateral boundaries of P+ diffusion 300 at the top substrate surface. N+ diffusion 304 is formed in a location on the upper surface of substrate 302 which is laterally spaced from both P+ diffusions 300 and 301.

Figure 3C:
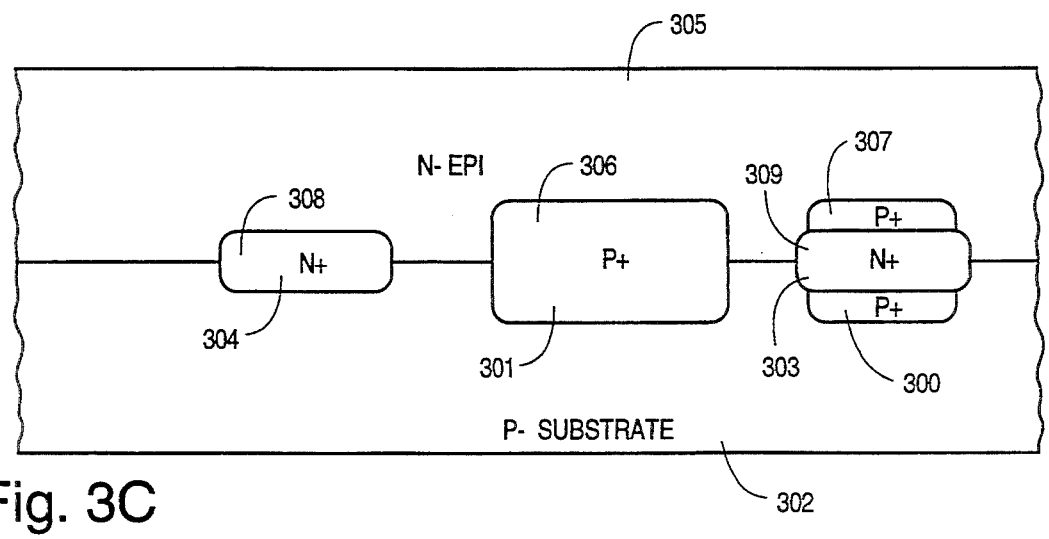

FIG. 3C shows an N- type epitaxial layer 305 disposed over the top surface of substrate 302. Two P+ regions 306 and 307 and two N+ regions 308 and 309 diffuse upward into the epitaxial layer 305 from corresponding region in the underlying substrate 302. The P+ type regions 306 and 307 are shown extending farther into the epitaxial layer 305 because the P type dopants diffuse faster than the N type dopants. N+ type region 303 is more heavily doped with N type dopants than P+ type region 300 is doped with P type dopants so region 309 in FIG. 3C has a net N+ type doping when both the P and N type dopants from the P+ region 300 and the N+ type region 303 diffused upward. The P type dopants from the P+ type region 300, however, diffuse farther and therefore form P+ type region 307 above region 309.

Figure 3D:
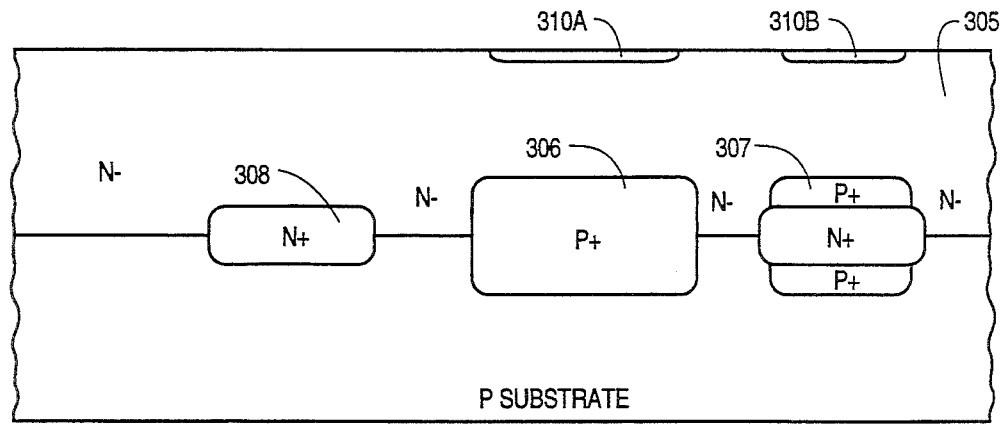

FIG. 3D shows two P type implants 310A and 310B formed in the upper surface of N- epitaxial layer 305 over P+ ]region 306 and P+ region 307, respectively.

Figure 3E:
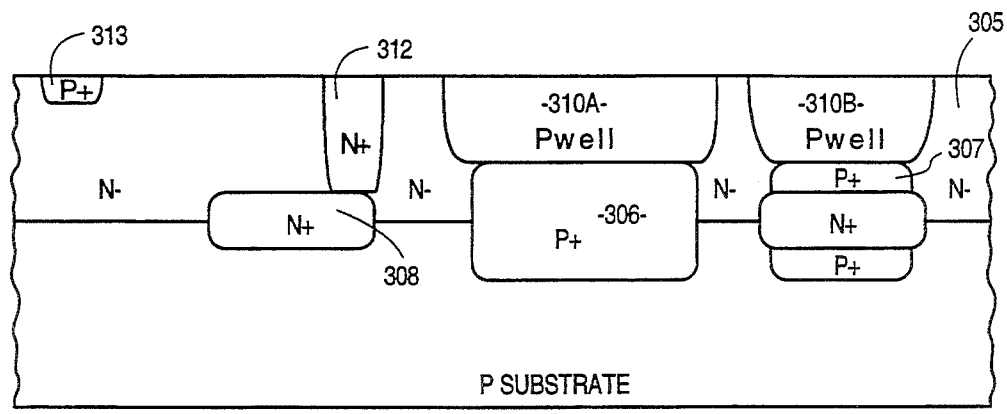

FIG. 3E shows P type regions 310A and 310B thermally diffused downward into the epitaxial layer 305 until P implant 310A meets the top of P+ region 306 and P implant 310B meets the top of P+ region 307. Diffused implant regions 310A-310B are called P wells. An N+ type sinker region 312 is diffused downward into the epitaxial layer 305 to reach deep into epitaxial layer 305 and to make contact with the underlying N+ region 308. A shallow P+ region 313 is also formed into the upper surface of epitaxial layer 305 at a location which is laterally spaced from P well regions 310A-310B and N+ type sinker 312.

Figure 3F:
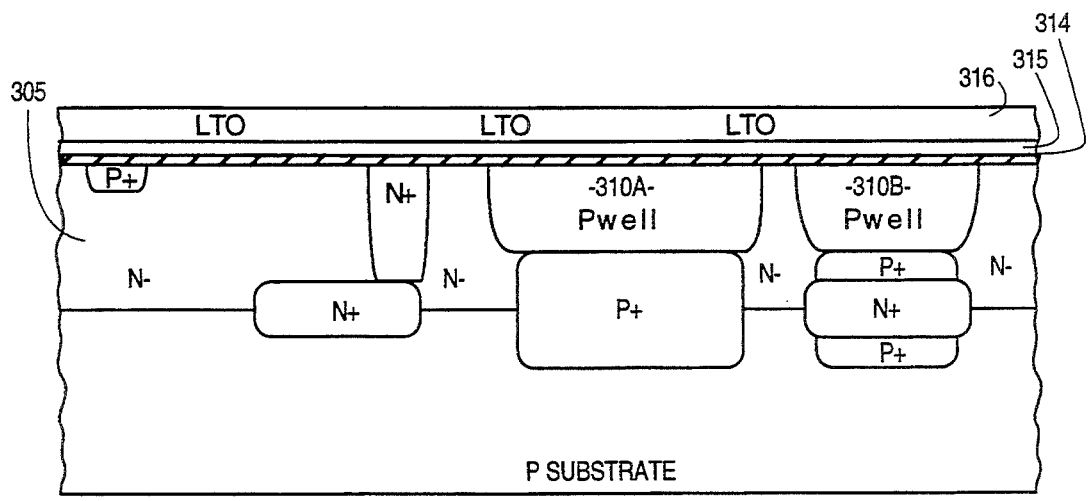

FIG. 3F shows a base oxide layer 314 formed on the upper surface of the epitaxial layer 305. A thin nitride layer 315 is then formed over the base oxide layer 314. A low temperature oxide (LTO) layer 316 is then formed over the thin nitride layer 315.

Figure 3G:
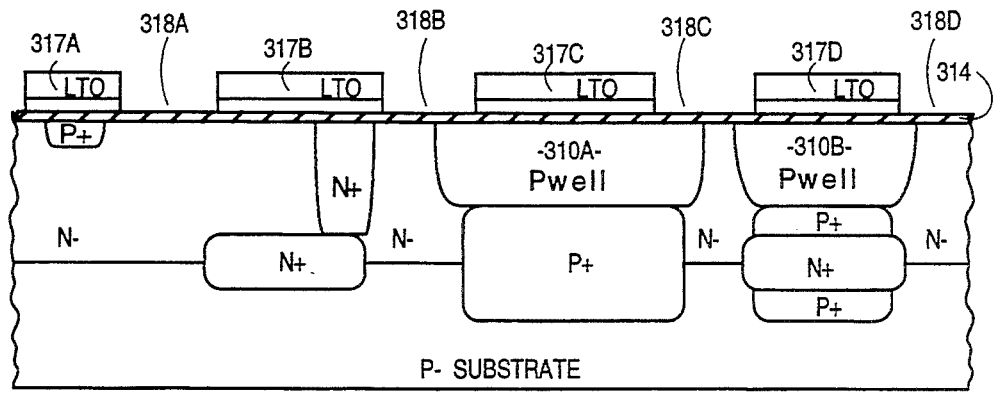

FIG. 3G shows the selective etching away of portions of the LTO and thin nitride layers 316 and 315 to form separate nitride/LTO regions 317A-317D and separate field region openings 318A-318D. The outer extent of regions 317A-317D comprise self-aligned implant boundaries for subsequent implantation steps.

Figure 3H:
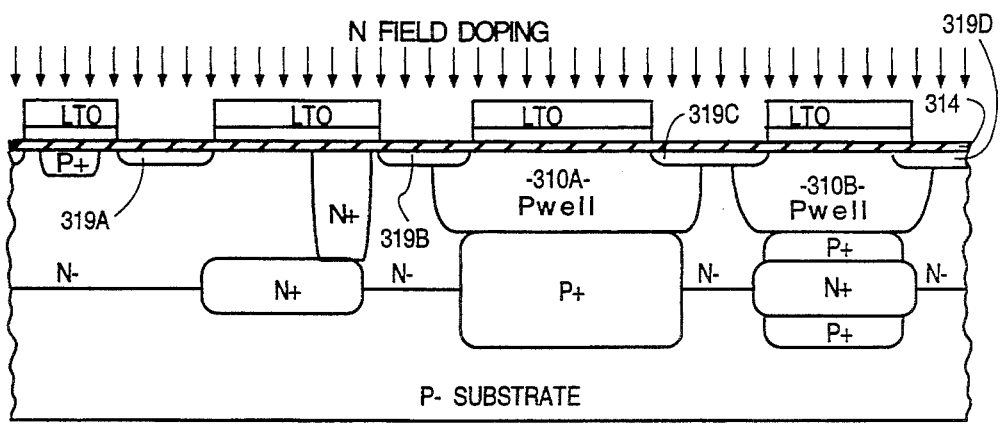

FIG. 3H shows a subsequent N field implant doping step in which an N type dopant such as phosphorous is implanted into the upper surface of epitaxial layer 305 at field region openings 318A-318D. This implant may, for example, be an implant of phosphorous ions accelerated to an energy of 60 KeV and driven into the spitaxial layer and diffused to a depth of 2.0 μm (20,000 Angstroms). As shown, this N field implant is performed through the base oxide layer 314. Base oxide layer 314 serves to protect the upper surface of the epitaxial layer 305 from damage during the implant. Accordingly, shallow N type regions 319A–319D are formed in the field regions 318A–318D, respectively.

Figure 3I:
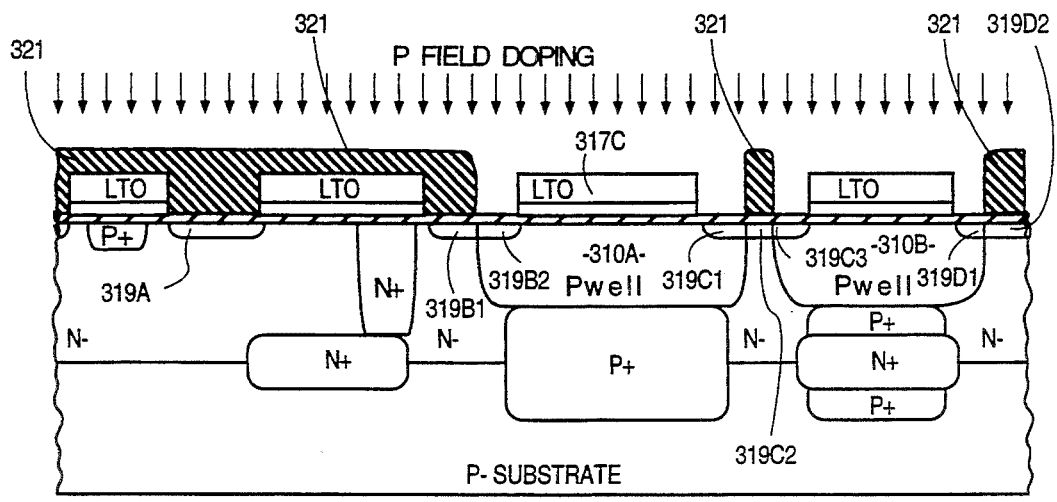

As shown in FIG. 3I, an implant mask 321 is then formed from photoresist so that each region 319B–319D has a masked portion 319B1, 319C2 and 319D2 covered by photoresist and also an unmasked portion 319B2, 319C1, 319C3, 319D1 uncovered by photoresist, respectively. Region 319A is completely covered by photoresist. A P field implant step is then performed with a P type dopant such as boron to form P type implant regions 319B2, 319C1, 319C3 and 319D1. The concentration of the P type dopant implanted into regions 319B2, 319C1, 319C3 and 319D1 is higher than the concentration of N type dopants in the previous N type implanting step so the net result is that each field region 318B–318D has an N type portion 319B1, and 319C2 and 319D2 and at least one P type portion 319B2, 319C1, 319C3, and 319D1.

As shown in FIG. 3I, LTO layer 316, nitride layer 315 and the underlying base oxide layer 314 together serve to mask the center portion of P well 310A as well as the center portion of P well 310B from the N field implant shown in FIG. 3H as well as from the following P field implant shown in FIG. 3I. The P type boron ions are, however, smaller than the relatively larger N type phosphorous ions. As a consequence, the boron ions penetrate farther through the LTO and nitride mask than do the phosphorous ions. The thickness of the mask in the embodiment described in FIGS. 3A–3L is, therefore, determined by the thickness required to stop the P type boron ions. Although any combination of nitride thickness and LTO thickness may be chosen to have a combined effect of stopping the implant ions, the nitride thickness should be chosen to be thin so that the subsequent field oxide growth after LTO removal will result in a small number of silicon defects while at the same time will result in protecting the underlying silicon from oxidation.

Figure 3J:
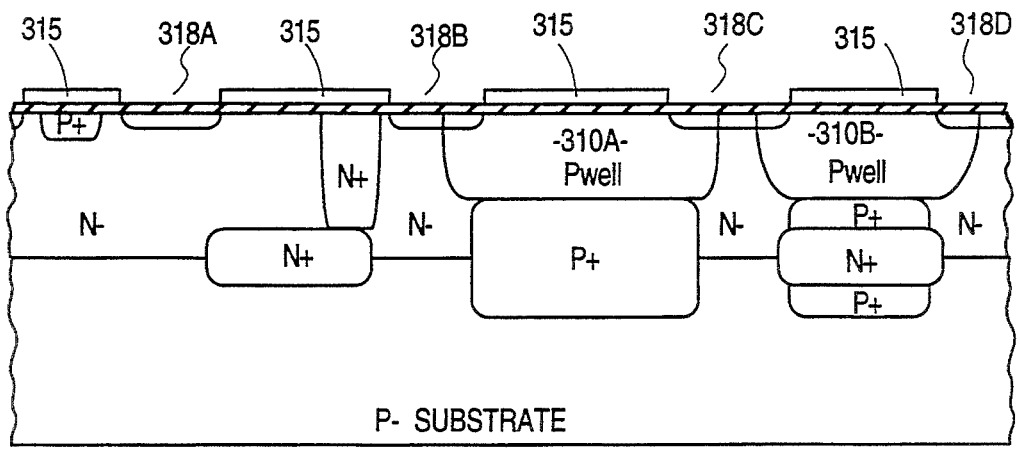

FIG. 3J shows the photoresist mask 321 removed and the LTO layer 316 removed. Thin nitride layer 315 is, however, left in the regions 317A–317D which separate field regions 318A–318D.

Figure 3K:
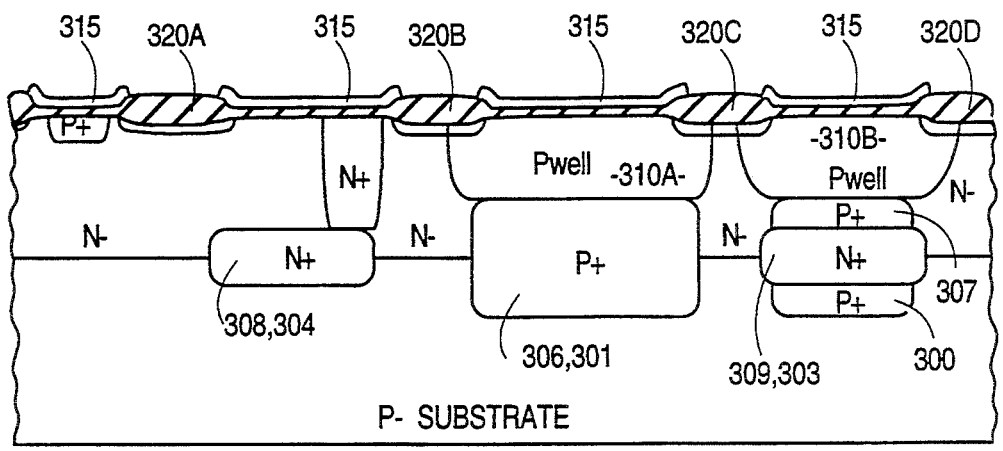

FIG. 3K shows a subsequent thermal oxidation of the top surface of the doped epitaxial layer 305 in the field regions 318A–318D to form thick field oxide regions 320A–320D. Region 319A forms a channel-stop region under thick field oxide 320A; regions 319B1 and 319B2 form a channel-stop region under thick field oxide 320B; regions 319C1, 319C2 and 319C3 form a channel-stop region under thick field oxide 320C; and regions 319D1 and 319D2 form a channel-stop region under thick field oxide 320D.

Figure 3L:
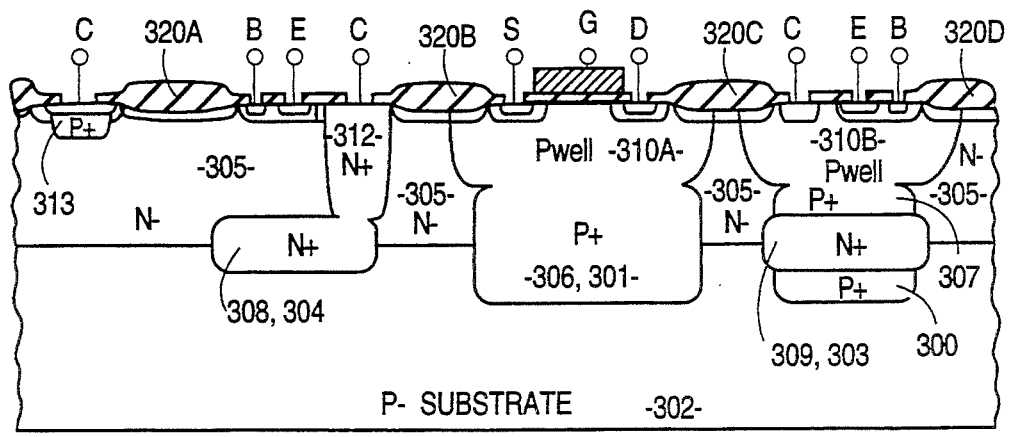

FIG. 3L is a cross-sectional view of a BiCDMOS structure multiple processing steps after FIGS. 3A–3K. A zener diode is formed into epitaxial layer 305 so that P+ region 313 becomes an anode region of the zener diode. A vertical NPN bipolar transistor is formed between field oxide regions 320A and 320B. An NMOS field effect transistor is formed into P well 310A between field oxide regions 320B and 320C. A vertical PNP bipolar transistor is formed into P well 310B between field oxide regions 320C an 320D.

Growing field oxide on bare silicon may result in silicon defects being formed underneath the field oxide. Accordingly, a base oxide of approximately 500 angstroms or more should be disposed over the field regions when the field oxide is grown. As described above, the relatively thick low temperature oxide of a field implant mask is removed from the active regions before the growing of field oxide in the field regions (see FIGS. 2E and 2F). Although the low temperature oxide of the field implant mask over the active regions is thicker than the base oxide over the field regions in the specific embodiment of FIGS. 2E and 2F, the low temperature oxide is less densified and therefore etches faster. Accordingly, some base oxide remains after the removal of the thicker low temperature oxide layer. It may, however, be desirable to have such a thick low temperature oxide layer to block implant ions that all the base oxide over the field regions would be removed during removal of the low temperature oxide portion of the field implant mask between FIGS. 2E and 2F. With little or no base oxide over the field regions, silicon defects may be formed in the subsequent field oxidation step.

FIGS. 4A–4I illustrate a specific embodiment in accordance with the present invention. Rather than forming what would otherwise have to be a thicker low temperature oxide layer to block ions during implanting of the field regions, a thinner low temperature oxide layer is provided and an additional layer of polysilicon is formed over the low temperature oxide layer to serve as part of the implant mask.

FIG. 4A shows a base oxide layer 400 disposed on substrate silicon or epitaxial silicon 401. Base oxide layer 400 may, for example, be thermal oxide grown at 900° C. to a thickness of 500 angstroms. A nitride layer 402 having, for example, a thickness of 1000 angstroms is formed on base oxide layer 400 and a low temperature oxide layer 403 having, for example, a thickness of 200 angstroms deposited at 400° C., is formed over nitride layer 402. A thick polysilicon layer 404 of, for example 2000 angstroms, is then deposited at about 640° C. over the low temperature oxide layer 403.

In some embodiments, the surface of the nitride layer is oxidized (for example, by thermal oxidation) thereby facilitating polysilicon deposition over the nitride without peeling. This thermal oxidation step also advantageously adds to the thickness of the base oxide layer so that there is more base oxide initially during subsequent removal of the low temperature oxide over the active region.

FIG. 4B shows a photoresist mask 405 disposed over the top of the polysilicon layer 404 in the active regions. The portion of the polysilicon layer 404 disposed in the field regions is then etched away using, for example, RIE dry plasma etching (a Drytek 384T, an AMT-5000, or a LAM Research dry plasma etcher). FIG. 4C shows the resulting polysilicon portion 404A of a field implant mask.

After forming of the polysilicon portion 404A, polysilicon portion 404A is used as an etch stopper during the formation of a low temperature oxide portion 403A of the field implant mask. A short HF 10:1 dip or dry etch may be used. FIG. 4D shows the resulting structure. Undercutting is slight because the low temperature oxide is thin.

The field regions are then implanted. The field implant may, for example, be a $1 \times 10^{14}$ cm$^{-2}$ dose of boron ions at an implant energy of 40–60 keV for a typical field threshold implant process using a polysilicon thickness of approximately 2000 Å. For a thicker polysilicon of approximately 4000 Å or thicker, boron is implanted deeper into the future field oxide region at, for example, 140 keV for a 0.3 μm depth.

Figure 4E:
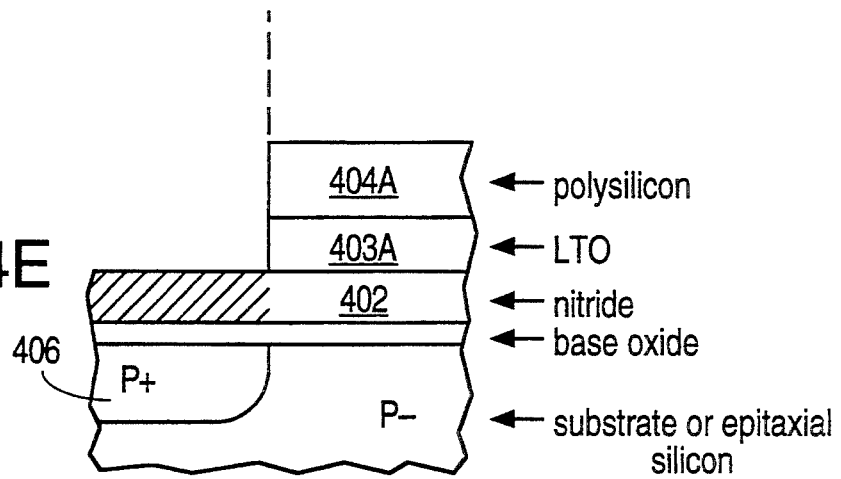

An implant mask comprising polysilicon portion 404A, low temperature oxide portion 403A, nitride layer 402, and base oxide layer 400 masks the active regions. The nitride layer 402 and the base oxide layer 400 disposed over the field regions are by themselves not enough to block the ions being implanted so the field regions are implanted through the nitride and base oxide layers. FIG. 4E shows the resulting structure. Region 406 is a field implant region.

Figure 4F:
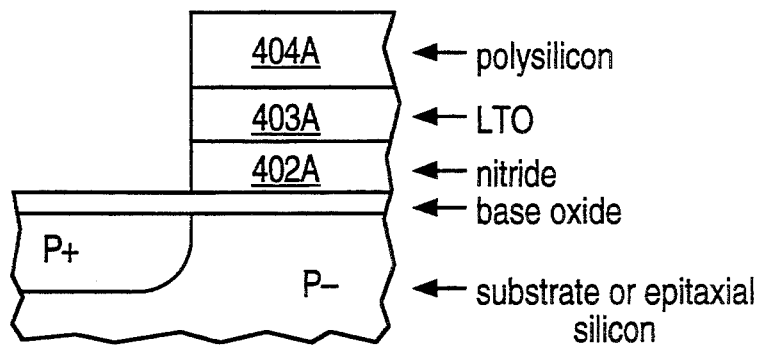

After the field implant step, the portion of the nitride layer 402 disposed over the field regions is removed by a suitable etcher (such as Tegal dry etcher) thereby forming a nitride portion 402A. The resulting structure is shown in FIG. 4F.

Figure 4G:
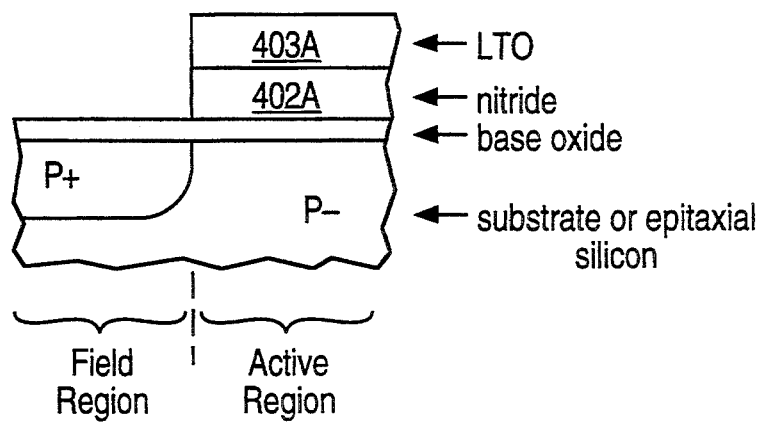

Polysilicon portion 404A over the active region is then removed by RIE dry plasma etching as above. The resulting structure is shown in FIG. 4G.

Figure 4H:
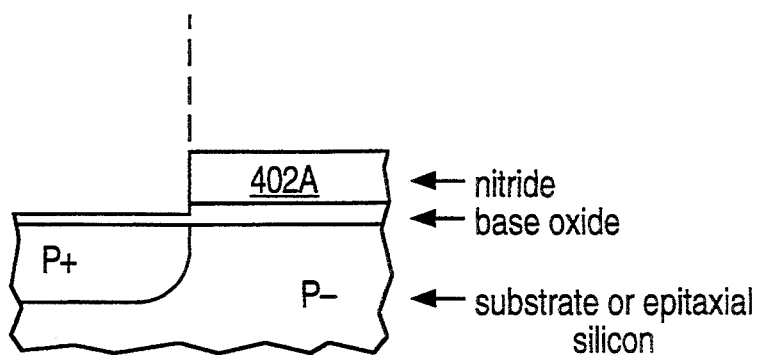

Next, low temperature oxide portion 403A is removed by a short HF 10:1 dip or dry etch. Because low temperature oxide portion 403A is made adequately thin with respect to the base oxide thickness due to the provision of polysilicon portion 404A in the implant mask, more of the baseoxide layer 400 remains in the field regions after the etching away of the low temperature oxide portion 403A. FIG. 4H illustrates a portion of the base oxide layer 400 remaining over the field regions. The full thickness of the base oxide layer remains in the active region.

Figure 4I:
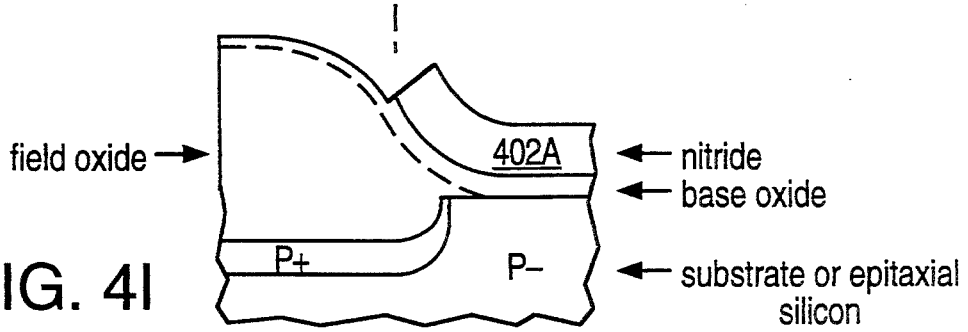

Next, the field oxide is grown and the bird's beak is formed with thin nitride portion 402A. FIG. 4I shows the resulting structure. Although specific thicknesses and structures are illustrated in FIGS. 4A–4I in order to illustrate one specific embodiment, it is to be understood that the thicknesses, temperatures, etching steps, and particular materials are only representative of one possible embodiment. In some embodiments, for example, a metal layer may be used in addition to or in place of polysilicon layer 404. Silicon nitride may also be employed in place of polysilicon layer 404.

In some embodiments, the portion of the nitride 402 disposed over the field regions is removed before the field implant step of FIG. 4D. The optionally removed nitride portion is shown hatched in FIGS. 4D and 4E.

Although the invention has been described by way of the above described embodiments, certain adaptations and modifications may be practiced using other manufacturing methods without departing from the scope of the invention as claimed in the appended claims. The invention is not limited to use in the above described BiCDMOS process but rather may be used in any process where a field oxide is to be self-aligned with an underlying field implant. The above description of the preferred embodiments is, therefore, presented merely for instructional purposes and is not intended to limit the scope of the claimed invention in any way.

We claim:

1. A method, comprising:
   thermally growing a base oxide layer over a surface of a semiconductor material;
   forming a nitride layer over said base oxide layer;
   forming a low temperature oxide layer over said nitride layer;
   forming a masking layer over said low temperature oxide layer;
   patterning said low temperature oxide layer and said masking layer such that a portion of said low temperature oxide layer and a portion of said masking layer form at least part of an implant mask;
   implanting dopant ions into a second region of said semiconductor material using said implant mask to mask a first region;
   removing said portion of said low temperature oxide layer and said portion of said masking layer such that said nitride layer is disposed over said first region of said semiconductor material but not over said second region of said semiconductor material; and
   thermally growing a field oxide layer in said second region of said semiconductor material after said removing.

2. The method of claim 1, wherein said masking layer is a layer of polysilicon.

3. The method of claim 1, wherein said masking layer is a layer of metal.

4. The method of claim 1, wherein at least a portion of said base oxide remains over said second region when said field oxide is thermally grown after said removing.

5. The method of claim 1, wherein said dopant ions are implanted with sufficient energy to pass through said masking layer.

6. The method of claim 1, wherein said masking layer is a layer of polysilicon, wherein said dopant ions are implanted with sufficient energy to pass through said masking layer, and wherein at least a portion of said base oxide remains over said second region when said field oxide is thermally grown after said removing.

7. The method of claim 2, wherein said masking portion and said low temperature oxide portion define a substantially vertical sidewall of said implant mask.

8. The method of claim 1, wherein said dopant ions are implanted through said nitride layer.

9. The method of claim 1, wherein said nitride layer disposed over said second region is removed prior to said implanting of dopant ions.

10. The method of claim 1, further comprising:
    forming a thermal oxide over said nitride layer prior to said forming of said low temperature oxide layer.

11. A method, comprising:
    forming a base oxide layer over a surface of a semiconductor material;
    forming a nitride layer over said base oxide layer;
    using a low temperature oxide layer/polysilicon layer sandwich structure disposed over a first region of said semiconductor material as at least part of an implant mask during implanting of dopant ions into a second region of said semiconductor material;
    removing said low temperature oxide layer/polysilicon layer sandwich structure such that said nitride layer is disposed over said first region of said semiconductor material but not over said second region of said semiconductor material; and
    thermally growing a field oxide layer in said second region of said semiconductor material after said removing.

* * * * *

UNITED STATES PATENT AND TRADEMARK OFFICE
CERTIFICATE OF CORRECTION

PATENT NO. : 5,439,842
DATED : August 8, 1995
INVENTOR(S) : Mike F. Chang, David G. Grasso and Jun-Wei Chen It is certified that error appears in the above-indentified patent and that said Letters Patent is hereby corrected as shown below:

Col. 1, line 19, delete "-".

Col. 6, line 34, delete "]".

Col. 6, line 63, delete "spitaxial" and insert --epitaxial--.

Col. 7, line 51, delete ".".

Col. 9, line 24, delete "baseoxide" and insert --base oxide--.

Signed and Sealed this

Thirteenth Day of February, 1996

Attest:

BRUCE LEHMAN

Attesting Officer

Commissioner of Patents and Trademarks